United States Patent [19]

Berger et al.

[11] 3,922,565

[45] Nov. 25, 1975

[54] MONOLITHICALLY INTEGRABLE DIGITAL BASIC CIRCUIT

[75] Inventors: Horst H. Berger, Sindelfingen; Siegfried K. Wiedmann, Stuttgart, both of Germany

[73] Assignee: International Business Machines Corporation, Armonk, N.Y.

[22] Filed: Nov. 28, 1973

[21] Appl. No.: 419,581

[30] Foreign Application Priority Data

Dec. 20, 1972 Germany .......................... 2262297

[52] U.S. Cl. .............. 307/213; 307/215; 307/303; 307/313; 307/317 A; 357/15; 357/44; 357/46

[51] Int. Cl.² .................. H01L 27/04; H03K 19/12; H03K 19/34

[58] Field of Search ..... 317/235 UA, 235 D, 235 E; 307/213, 215, 317 A, 303, 313; 357/15, 44, 46, 50

[56] References Cited

UNITED STATES PATENTS

| | | | |
|---|---|---|---|
| 3,136,897 | 6/1964 | Kaufman | 307/213 |
| 3,209,214 | 9/1965 | Murphy et al. | 307/215 |
| 3,302,079 | 1/1967 | Barditch | 307/213 X |
| 3,564,443 | 2/1971 | Nagata | 307/213 X |
| 3,571,674 | 3/1971 | Yu et al. | 317/235 UA |
| 3,573,573 | 4/1971 | Moore | 307/303 |
| 3,575,646 | 4/1971 | Karcher | 357/49 |
| 3,611,067 | 10/1971 | Oberlin et al. | 317/235 UA |
| 3,623,925 | 11/1971 | Jenkins et al. | 317/235 UA |
| 3,648,125 | 3/1972 | Peltzer | 357/50 |
| 3,657,612 | 4/1972 | Wiedmann | 317/235 |
| 3,736,477 | 5/1973 | Berger et al. | 317/235 D |
| 3,751,680 | 8/1973 | Hodges | 307/213 |
| 3,823,353 | 7/1974 | Berger et al. | 357/44 |

FOREIGN PATENTS OR APPLICATIONS

| | | |
|---|---|---|
| 2,021,824 | 11/1971 | Germany |

*Primary Examiner*—William D. Larkins
*Attorney, Agent, or Firm*—Theodore E. Galanthay

[57] ABSTRACT

Disclosed is a circuit showing a switching transistor whose base is connected to diodes forming the logical inputs and whose collector forms the logical output. Power supply is effected by charge carrier injection into the emitter of the switching transistor. To this end, a complementary transistor is employed, whose emitter terminal is connected to a voltage source and whose collector and base are linked with the base and the emitter of the switching transistor respectively. The collector of the switching transistor and the diodes are made up of Schottky contacts on the semiconductor zone forming the base of the switching transistor. Also disclosed is a semiconductor structure of the circuit consisting of a layered structure with a first, second, and third semiconductor layers of alternating conductivity types. The first and second layers are ohmically contacted, whereas the third layer is provided with the Schottky contacts. The second layer simultaneously forms the emitter of the switching transistor and the base of the complementary transistor whose emitter is made up of the first layer. The third layer simultaneously forms the collector of the complementary transistor and the base of the switching transistor.

12 Claims, 10 Drawing Figures

MONOLITHICALLY INTEGRABLE DIGITAL BASIC CIRCUIT

BACKGROUND OF THE INVENTION

1. Field of the Invention

This invention relates to a monolithically integrable, digital basic circuit consisting of a switching transistor linked with a suitable power supply and to the base of which diodes are connected.

2. Description of the Prior Art

The dimensions and doping profiles of structures fabricated in bipolar monolithic technology are essentially with respect to one planar surface of a semiconductor chip. The methods employed to this end are known under the term "planar technology", whereby the various elements are arranged on a common semiconductor chip, contacting each other by means of overlying conductors. In most cases the basic material used consists of a relatively low-doped silicon wafer serving as a substrate on which a thin low-doped monocrystalline silicon layer is epitaxially grown. In successive photolithographic steps followed by diffusion processes the required structures forming the PN junctions are introduced into this expitaxially grown silicon layer. Because the conductivity of the expitaxial layer is relatively high, suitable isolation of the various circuit elements on a common semiconductor chip is essential. With the isolation method generally employed, isolation pockets are formed in such a manner that separate semiconductor regions containing the various circuit elements are fabricated with additional diffusion zones forming backward insulating PN junctions. The interleaved active semiconductor zones of a transistor must have a particular minimum surface area which can be contacted as required. Additional surface requirements are incurred by the lateral out-diffusion of the isolation zones surrounding the active zones and which must penetrate the epitaxial layer down to the substrate. This means that known structures of this kind due to their dimensions and doping profiles generated by diffusion fail to yield optimal results where circuits having an extremely high density and minimum power dissipation are to be produced. They have the additional disadvantage that the charge storage of the transistors is difficult to control in the saturated state. Apart from this, the manufacturing methods required for them are costly and elaborate as relatively many masking and diffusion steps are needed.

For reasons of cost and reliability it is desirable, therefore, that as many circuit components as possible be arranged on a single semiconductor chip. It is equally desirable that the steps required for fabricating monolithic semiconductor circuits be simplified and reduced. In order to arrange a greater number of circuit components on a single semiconductor chip, it is necessary as a rule to increase the chip surface. When increasing chip size, however, the number of chips obtainable from a circular wafer decreases, as does the yield of serviceable chips on a wafer. Accordingly, a high-yield circuit layout must be such that only a small surface is required. In order to meet these requirements and to reduce the problems described, the "usual layout technology" of monolithic bipolar circuits, according to which a special isolation pocket is provided for each circuit element, has been improved so that several circuit components can be combined in a single isolation pocket. To this end, similar semiconductor zones connected to the same potential are formed preferably jointly. It is known that NPN and PNP transistors may be jointly integrated in a four-layer structure (Microelectronic Circuits and Application, J.M. Carrol, McGraw-Hill, 1965, p. 76, FIG. 4). However, the just described area-consuming isolation diffusion cannot be dispensed with. Also, there is neither a process simplification nor a reduction in the number of process steps for the circuit components realized within the isolation pockets.

German Offenlegungsschrift 2 021 824 (U.S. Pat. No. 3,736,477) refers to an improved monolithic layout of the just described known circuit with two complementary transistors. The OS also provides for this circuit to be used as a basic component of a logical semiconductor circuit concept. To insure a high packing density, this logical circuit concept is designed in such a manner that a basic semiconductor material of a first conductivity type comprises, spaced from each other, at least two oppositely conductive areas serving as emitter and collector zones of a lateral transistor structure. The collector zone of the lateral transistor sturcture contains at least one further oppositely conductive zone as a collector zone of an inversely operated transistor structure. To operate this semiconductor structure as a logical basic circuit, a current is impressed in the emitter zone of the lateral transistor structure. The current flow serving as an output signal and traversing the vertical transistor structure is controlled by this current as a function of the input signal applied to its associated collector zone.

This just described structure or logical basic circuit can be universally employed for a multitude of logical networks by combining several such basic circuits, which may be operated as NOR circuits, etc. being combined in a particular manner. It is pointed out that owing to the absence of isolation diffusion regions — the individual basic circuits can be contiguously integrated — and owing to the elimination of diffused resistors considerable area savings are obtained over known logical circuit families. In addition, the manufacturing process is simplified and corresponds to that used to fabricate a single planar transistor. It is also pointed out that the area requirements are governed by the lateral structure of the single transistor, whereby the various diffusion zones penetrating the surface must have certain particular dimensions. Apart from this, two transistor zones call for selective diffusion processes. Finally, it is pointed out that the logic function and the power supply are to be separately wired.

Also known in connection with this logical basic circuit is a monolithic structure (U.S. Pat. No. 3,823,353) which has been improved with regard to the integration density and the area requirements, respectively, as well as with regard to an optimal speed/efficiency ratio and the manufacturing process. This semiconductor structure is characterized in that it consists of a first layer of an opposite second conductivity type applied to a substrate of a first conductivity type, of a second layer of the first conductivity type applied to the first layer, and of a third layer of a second conductivity type applied to the second layer, and that for contacting the individual layers, each partial structure is surrounded in the form of a frame by zones penetrating the superimposed layers and the conductivity type of which corresponds to that of the layer to be contacted. The substrate forms the emitter of the second transistor, the first layer the emitter of the first and the base of the second transistor, the second layer the base of the first and the collector of the second transistor, and the third layer the collector of the first transistor of the known circuit.

Although the previously proposed version of the logical basic circuit has many advantages over the known version, one of its disadvantages is the difficulty of increasing the cut-off frequency to extremely high values where normal transistors are used. The reasons for this is that the transistors are operated in saturation. Saturation, however, leads to the switching speeds obtainable being reduced.

SUMMARY OF THE INVENTION

It is an object of the invention to improve the previously proposed basic circuit and its semiconductor structure, respectively, in such a manner that the effect of saturation is completely eliminated and that as a result extremely high cut-off frequencies and switching speeds are obtained.

It is another object of this invention that the advantages offered by the previously proposed basic circuit and which are a simple structure, a high integration density, low power dissipation in connection with an optimal speed/efficiency ratio as well as a simplified manufacturing process are to be maintained.

In accordance with the invention, this problem is solved by a monolithically integrable, digital basic circuit, consisting of a switching transistor connected to a suitable power source and to the base of which diodes are connected, in that the collector of the switching transistor and the diodes are made up of Schottky contacts on the semiconductor zone forming the base of the switching transistor. To this end, favorable saturation properties of a transistor comprising a Schottky collector are suitably utilized.

A particularly advantageous structure consists in the emitter and the base of the switching transistor being made up of a layer structure with two semiconductor layers of different conductivity types.

A preferred embodiment is characterized in that the power supply consists of a transistor complementary to the switching transistor, and the collector and base of which are respectively linked with the base and the emitter of the switching transistor, and through which charge carriers are injected into the emitter of the switching transistor. It is advantageous for the Schottky barriers for the collector on the one hand and the diodes on the other to be different.

The diodes preferably form the inputs and the collector of the switching transistor the output of the basic circuit representing a NOR function. For representing complex logic functions several basic circuits are suitably combined. To adapt the input and output levels to each other, the Schottky barrier for the Schottky contact forming the collector is chosen to be higher than the barriers for the Schottky contacts forming the diodes. For representing an OR function, the collectors of several basic circuits, which form the common output, can be directly linked with each other.

An advantageous structural embodiment is characterized in that the basic circuit consists of a layer structure with a first, a second (center), and a third semiconductor layer of alternating conductivity types, that the first and the second semiconductor layer are ohmically contacted, and that the third semiconductor layer comprises Schottky contacts. This structure is characterized in particular in that the second semiconductor layer concurrently forms the emitter of the switching transistor and the base of the additional transistor, the emitter of which consists of the first semiconductor layer, and that the third semiconductor layer concurrently forms the collector of the additional transistor and the base of the switching transistor.

For contacting, the first semiconductor layer is directly provided with an ohmic contact, whereas the second semiconductor layer is ohmically contacted via a highly doped contacting zone traversing the third semiconductor layer and being of the same conductivity type as the second semiconductor layer.

An advantageous embodiment of complex logical networks is characterized in that a random number of logical networks consisting of several basic circuits have a common layer structure.

A further preferred embodiment is characterized in that the complementary transistor is designed as a lateral structure, whereby the first semiconductor layer forming the emitter of the complementary transistor is replaced by a suitably doped semiconductor zone disposed within a contacting zone in relation to the second semiconductor layer.

Advantageous embodiments with regard to the mutual isolation of individual jointly integrated basic circuits are characterized in that the individual basic circuits are isolated against each other by means of an isolation zone surrounding their structure in a framelike fashion and traversing the third semiconductor layer. In this connection it is advantageous for the isolation zone to consist of a highly doped semiconductor zone whose conductivity type corresponds to that of the second semiconductor layer, whereby the second semiconductor layer can be contacted via the highly doped semiconductor zone serving as an isolation zone. Further embodiments concerning the isolation are characterized in that the isolation zones consist of semiconductor oxide or are replaced by mesa etching.

To prevent parasitic injection currents in that part of the base zone of the switching transistor, which accommodates the diodes, provisions are made for the third semiconductor layer to be subdivided by means of a separating zone into a first partial area for the collector Schottky contact and into a second partial area for the diode Schottky contacts. In this connection it is advantageous for the two partial areas to be connected to each other by a similar but highly doped buried semiconductor zone which, arranged between the second and third semiconductor zones, is disposed substantially below the second partial area. Preferred embodiments of the separating zone are characterized in that the separated zone is produced by mesa etching, or that the separating zone is made up of an isolation zone, or that the separating zone corresponds to the isolation zone surrounding the structure of the basic circuit in a framelike fashion, or that finally the separating zone consists of a semiconductor zone doped in accordance with the buried semiconductor zone and connecting the latter to the surface of the third semiconductor zone.

The foregoing and other objects, features and advantages of the invention will be apparent from the following more particular description of the preferred embodiments as illustrated in the accompanying drawings.

DESCRIPTION OF THE PREFERRED EMBODIMENTS

Figure 1:
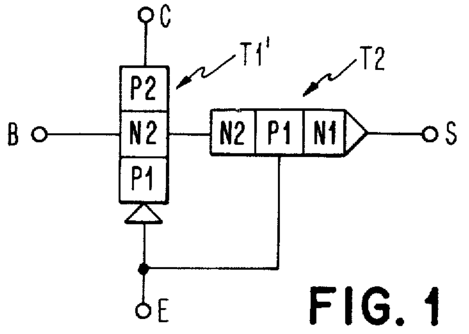
FIG. 1 is the electric equivalent circuit diagram of a semiconductor structure, on which the logical circuit in accordance with the invention is based.

Refer now to the logical basic circuit shown in FIG. 1, which is being used in the known arrangement to which German Offenlegungsschrift 2 021 824 (U. S. Pat. No. 3,736,477) relates. FIG. 1 shows two complementary transistors T1' and T2, the collector of NPN transistor T2 being connected to base terminal B of PNP transistor T1'. In addition, the base of transistor T2 is connected to emitter terminal E of transistor T1'. Via emitter terminal S of NPN transistor T2 a current is fed to the base of PNP transistor T1'. Collector terminal C of PNP transistor T1' forms the output of the circuit. As can be seen from the equivalent circuit diagram, the two transistors have similar semiconductor zones which are connected to the same potential. Therefore, these semiconductor zones are identically referenced and can be arranged in common semiconductor zones when the semiconductor structure is realized. The basic circuit functions as follows. If no defined potential is applied to the common collector-base terminal B, the current impressed in NPN transistor T2 flows into the base of PNP transistor T1' which is thus saturated. If, however, the common collector-base terminal B is at ground potential, the current impressed transistor T2 is withdrawn via this terminal and cannot flow into the base of transistor T1'. This leads to the latter transistor becoming blocked. Considering the potentials occurring in each case on collector terminal C of transistor T1', an inverter element is formed by combining the two transistors T1' and T2.

A random number of logic functions can be performed by suitably combining such inverter elements. For the purpose of coupling the various inverter elements connected to one another via the collector of their switching transistor, each collector is provided with one or several coupling diodes. The limitation in the maximum switching speed is attributable to the switching transistor being saturated so that a charge storage occurs in the collector.

Figure 2:
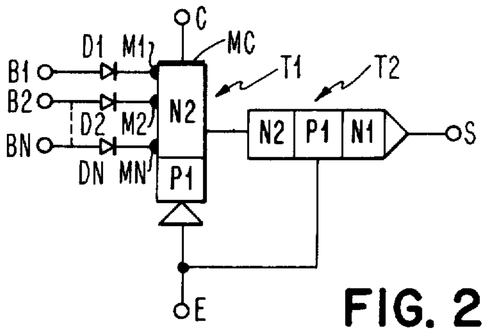
FIG. 2 is the corresponding electric equivalent circuit diagram schematically depicting the invention.

FIG. 2 is an equivalent circuit diagram of the semiconductor structure in accordance with the invention. The circuit again comprises a switching transistor T1 with an emitter terminal E and a collector terminal C. Collector terminal C forms the output of the logical basic circuit. To insure that current is supplied to switching transistor T1, a complementary transistor T2 is provided, whose collector N2 and base P1 are respectively connected to base N2 and emitter P1 of switching transistor T1. As can be seen from FIGS. 1 and 2, the equivalent circuit diagrams differ from each other in that in lieu of PNP switching transistor T1' of the known basic circuit, the basic circuit in accordance with the invention comprises a so-called Schottky collector transistor with an emitter P1, a base N2, and a Schottky contact MC arranged on the base zone and serving as a collector. Schottky contacts M1 to MN, forming further diodes D1 to DN, are also arranged on the base zone. One electrode of each of these diodes is connected to one of the associated terminals B1 to BN. Terminals B1 to BN form logical inputs of the basic circuit. As the logic functions are implemented, coupling is effect via diodes D1 to DN.

Figure 3A:
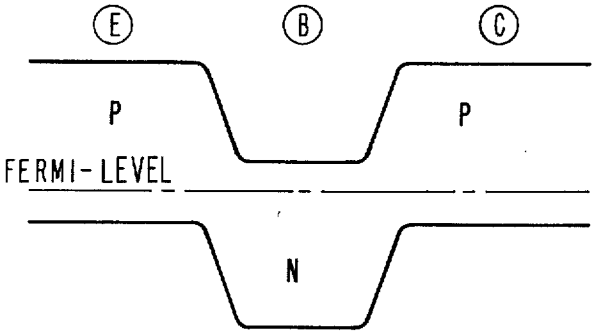
FIGS. 3A and 3B are a comparison of the energy-band diagrams of a standard PNP transistor and a Schottky collector transistor.
Figure 3B:
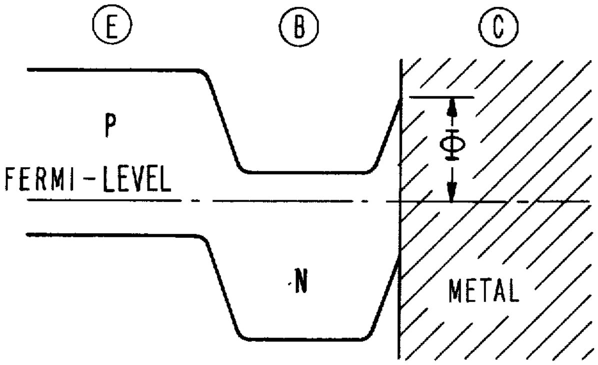

Before describing the function and advantages of the basic circuit (FIG. 2) in detail, attention is drawn to FIGS. 3A and 3B which are schematic representations of qualitative energy band diagrams for a standard PNP transistor (FIG. 3A) and a Schottky collector transistor (FIG. 3B). A comparison shows that the energy band diagram for the Schottky collector transistor in which the P doped collector zone is replaced by a Schottky metal contact at least bears a close resemblance to the energy band diagram for the PNP transistor. The great similarity of the potential curve in the area of the collectors make it quite obvious that the Schottky contact can also be used as a collector. The magnitude of the Schottky barrier on the base metal contact junction is governed by the metal employed. Thus, Schottky contacts having barriers of different magnitudes can be generated by using different metals.

It has been found that a Schottky collector transistor of this kind, in comparison with a standard transistor, has very favorable characteristics in particular with regard to the saturation behavior. It is a particular feature that no charge storage occurs in the collector. As this transistor type has an extremely low to BN, current amplification, there is no internal current amplification either. This characteristic leads to but a minimum charge being stored during saturation. The favorable behavior of the Schottky diodes is insured by the charge storage being proportional to the minority carrier diffusion current. In comparison with a standard semiconductor junction, the diffusion current of the Schottky contact is several orders lower.

Thus, the function of the logical basic circuit (FIG. 2) in accordance with the invention, which may in principle be compared with the function of the known circuit of FIG. 1, is as follows. Schottky collector transistor T1 used as a switching transistor receives its current via transistor T2. To this end, a forward bias or a suitable current is applied in between terminals E and S. Transistor T2 may be regarded as a constant current source which, via collector N2, impresses a current into base N2 of Schottky collector transistor T1. If a defined potential representing a logical "0" and at which diodes D1 to DN are blocked is applied to each of the logical inputs B1 to BN, the impressed current flows directly into the base of switching transistor T1. The transistor becomes conductive and a potential denoting a logical "1" occurs on collector terminal C. If, on the other hand, a potential denoting a logical "1" and at which the corresponding diodes D1 to DN become conductive is applied to one or several inputs B1 toBN, the impressed current is discharged through the conductive diodes. Schottky collector transistor T1 remains blocked and a potential denoting a logical "0"

occurs on collector terminal C. Thus, this basic circuit obviously produces a NOR function. As is known, all kinds of basic logic functions and complex logical networks can be realized by suitably combining several such basic circuits. Also, an OR function is obtained by simply combining several collector terminals C of different basic circuits. Thus, a logic function can be produced via diodes D and/or by connecting collector terminals C of the basic circuits.

Figure 4:
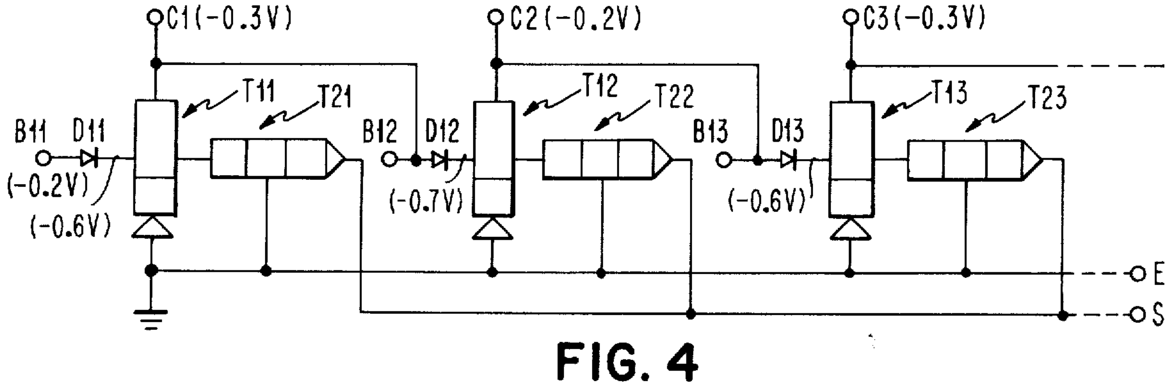
FIG. 4 shows a series of inverter circuits including basic circuits in accordance with the invention.

Refer now to FIG. 4 showing an inverter chain made up of three basic circuits in accordance with the invention. Schottky collector transistors T11, T12 and T13 are the switching transistors of the three-step inverter chain as shown. As a result of potentials applied to the common terminals E and S, transistors T21, T22 and T23 each carry a constant current. Each of the three basic circuits has one input diode D11, D12 and D13, respectively, which is connected to the associated input terminal B11, B12, or B13. Collector terminals C1, C2 and C3 forming the outputs of the basic circuits are in each case linked with the input of the subsequent stage. In the circuit of the inverter chain the voltage levels occurring are shown in brackets, assuming that the forward voltages of diodes D11, D12 and D13 and of the base Schottky diodes are 0.4 and 0.5V, respectively. In this case the logical levels can be defined in such a manner that about o.2 V correspond to a logical 1 and about 0.3 V to a logical 0. In the considered example this means that a logical "1" is applied to input B11 of the first inverter stage. Switching transistor T11 is thus blocked and a logical 0" appears on output C1. As in this case a logical "0" is applied to input B12 of the second inverter stage, switching transistor T12 is conductive and a logical "1" is obtained on output T2. In the third inverter stage this logical "1" is reinverted, so that a logical "0" occurs on output C3.

Semiconductor structures forming the circuit in accordance with the invention are shown in FIGS. 5 to 9. The designations of the semiconductor layers, the terminals, and the Schottky contacts are identical in the equivalent circuit diagram of FIG. 2 and in FIGS. 5 to 9 showing the corresponding structures, so that the various elements may be readily associated with each other. The designations of the semiconductor layers simultaneously indicate the conductivity type.

Figure 5:
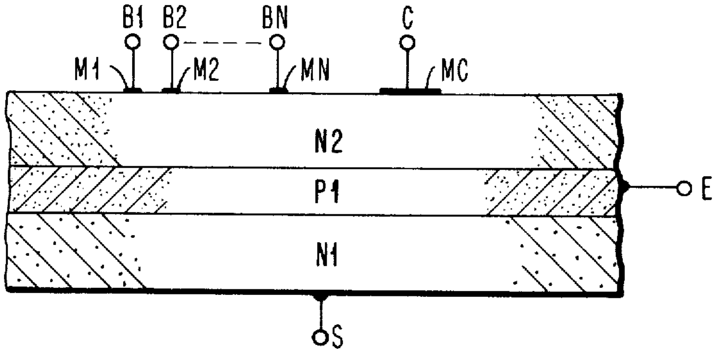
FIG. 5 is a schematic sectional view of a first typical embodiment of the semiconductor structure of the logical basic circuit in accordance with the invention.

The simplest semiconductor structure in accordance with the invention is shown in FIG. 5. This semiconductor, incorporating the equivalent circuit of FIG. 2, is a layer structure made up of a first semiconductor layer N1, a second semiconductor central layer P1, and a third semiconductor layer N2. Schottky contacts M1 to MN forming diodes D1 to DN connected to terminals B1 to BN are arranged on the third semiconductor layer N2. Also arranged on the third semiconductor layer is Schottky contact MC forming the Schottky collector. The second semiconductor layer P1 and the first semiconductor layer N1 are ohmically contacted and connected to the associated terminals E and S. A comparison with the equivalent circuit diagram of FIG. 2 shows that the first semiconductor layer N1 forms the emitter of transistor T2. The second semiconductor layer P1 simultaneously provides the base of transistor T2 and the emitter of transistor T1. The third semiconductor layer N2 in its turn provides the base of transistor T1 and the collector of transistor T2. The structure of FIG. 5 comprises the fully integrated basic circuit of FIG. 2 with the P1N2MC Schottky collector transistor as a switching transistor T1, and, for the power supply, complementary N1P1N2 transistor T2 with the necessary external terminals B, C, S, and E and coupling diodes D on the input.

Figure 6:
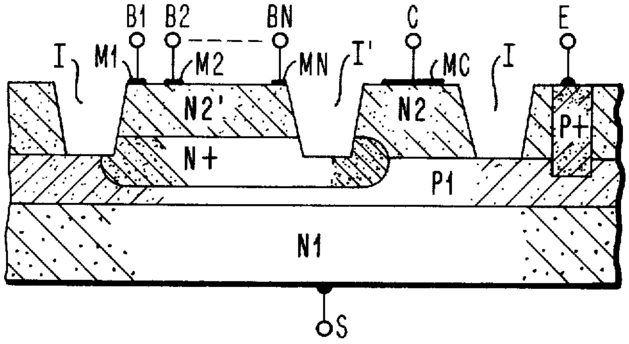
FIG. 6 is a schematic sectional view of a second embodiment in mesa etching technology.

The embodiment of FIG. 6 differs from that of FIG. 5 in that the third semiconductor layer N2 by means of mesa-etched separating and isolation zones I, I', respectively, is subdivided into a partial area N2' accommodating Schottky contacts M1 to MN forming the diodes, and into a partial area N2 accommodating Schottky contact MC forming the collector of the switching transistor. This insures that these two partial areas are separated from each other. A buried highly doped zone $N^+$ extending into partial area N2 is arranged underneath partial area N2'. This buried zone prevents the injection of currents into partial area N2', which might detrimentally affect the function of the basic circuit. The second central layer P1 contacted via a highly doped contacting zone $P^+$ traversing the third semiconductor layer N1 and which is connected to terminal E via an ohmic contact. Contacting may also be effected within a further mesa-etched region.

Figure 7:
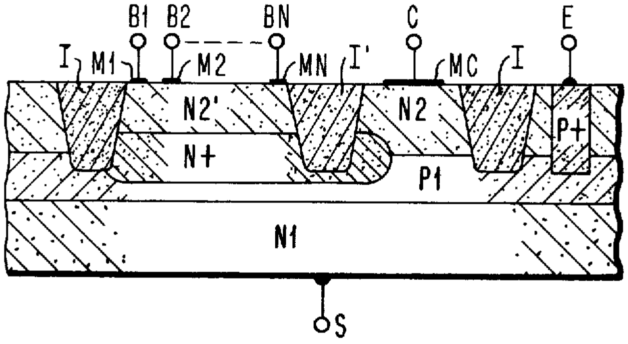
FIG. 7 is a schematic sectional view of a third embodiment in oxide isolation technology.

The only difference between the embodiment of FIG. 7 and that of FIG. 6 is that the former comprises a separating or isolation zone I, I' consisting of insulating material, in particular of an oxide of the semiconductor material.

Figure 8:
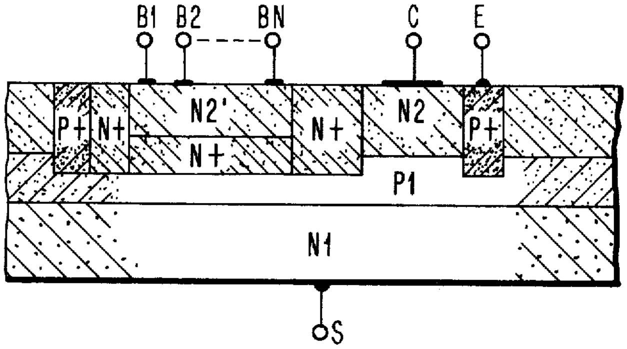
FIG. 8 is a schematic sectional view of a fourth embodiment in junction isolation technology.

In the case of the embodiment of FIG. 8, the separating zone for subdividing partial areas N2' and N2 consists of a semiconductor zone $N^+$ surrounding partial area N2' in a framelike fashion and emanating from the correspondingly doped buried zone on which it is superimposed. Isolation of the basic structure proper is effected by means of contacting zone $P^+$ for central semiconductor layer P1, which also surrounds the basic structure in a framelike fashion.

Figure 9:
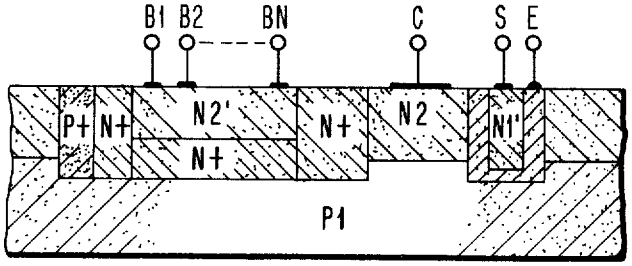
FIG. 9 is a sectional view of a fifth embodiment using a lateral rather than a vertical transistor for the power supply of the switching transistor.

Finally, FIG. 9 shows an embodiment, whereby, in comparison with the embodiment of FIG. 8, the first semiconductor layer N1 is eliminated and is replaced by semiconductor zone N1' arranged within the frameshaped isolation or contacting zone. This means that vertical N1P1N2 transistor T2 provided in the preceding embodiments is replaced by a lateral N1'P1N2 transistor.

With regard to the method of producing the logical basic circuit in accordance with the invention, it is pointed out that the standard planar technological processes can be applied in a known manner.

While the invention has been particularly shown and described with reference to preferred embodiments thereof, it will be understood by those skilled in the art that various changes in form and detail may be made therein without departing from the spirit and scope of the invention.

What is claimed is:

1. Monolithically integrable, digital basic circuit comprising:

a switching transistor coupled with a suitable power supply, the base region of said transistor having diodes connected thereto, characterized in that the collector of the switching transistor and the diodes are formed as Schottky contacts on the semiconductor zone forming the base region of the switching transistor, wherein the Schottky barriers for the Schottky contact forming the collector and for the Schottky contacts forming the diodes are chosen to be different.

2. Monolithically integrable, digital basic circuit in accordance with claim 1, characterized in that the emitter and the base of the switching transistor are made up of a layer structure with two semiconductor layers of different conductivity types.

3. Monolithically integrable, digital basic circuit in accordance with claim 1, characterized in that power supply is effected by charge carriers being injected into the emitter of the switching transistor.

4. Monolithically integrable, digital basic circuit in accordance with claim 3, characterized in that the power supply consists of a transistor complementary to the switching transistor and the collector and base of which are respectively linked with the base and the emitter of the switching transistor, and through which charge carriers are injected into the emitter of the switching transistor.

5. Monolithically integrable, digital base circuit in accordance with claim 3, characterized in that the basic circuit consists of a layer structure with a first, a second and a third semiconductor layer of alternating conductivity types that the first and the second semiconductor layer are ohmically contacted, and that the third semiconductor layer is provided with Schottky contacts.

6. Monolithically integrable, digital basic circuit in accordance with claim 5, characterized in that the second semiconductor layer simulataneously forms the emitter of the switching transistor and the base of the additional transistor whose emitter consists of the first semiconductor layer and that the third semiconductor layer simultaneously forms the collector of the additional transistor and the base of the switching transistor.

7. Monolithically integrable, digital basic circuit in accordance with claim 5, characterized in that the first semiconductor layer is directly provided with an ohmic contact, whereas the second semiconductor layer is ohmically contacted via a highly doped contacting zone traversing the first semiconductor zone and being of the same conductivity type as the second semiconductor layer.

8. Monolithically integrable, digital basic circuit in accordance with claim 3, characterized in that the semiconductor layer forming the base of the switching transistor is subdivided by means of a separating zone into a first partial area for the collector Schottky contact and into a second partial area for the diode Schottky contacts.

9. Monolithically integrable, digital basic circuit in accordance with claim 1, characterized in that the inputs and the outputs are respectively formed by the diodes and the collector of the switching transistor.

10. Monolithically integrable, digital basic circuit comprising:

a switching transistor coupled with a suitable power supply, the base region of said transistor having diodes connected thereto, characterized in that the collector of the switching transistor and the diodes are formed as Schottky contacts on the semiconductor zone forming the base region of the switching transistor, wherein the inputs and the outputs are respectively formed by the diodes and the collector of the switching transistor, and that for adapting the input and output levels, the Schottky barrier for the Schottky contact forming the collector is chosen to be higher than the barriers for the Schottky contacts forming the diodes.

11. Monolithically integrable, digital basic circuit in accordance with claim 10, characterized in that for representing complex logical networks several basic circuits, each forming a NOR function, are suitably combined.

12. Monolithically integrable, digital basic circuit in accordance with claim 10, characterized in that for representing an OR function, the collectors of several basic circuits, which form the common output, can be directly linked with each other.

* * * * *